(12) United States Patent
Sasaoka et al.

(10) Patent No.: US 8,198,541 B2
(45) Date of Patent: Jun. 12, 2012

(54) ELECTRONIC COMPONENT BUILT-IN WIRING BOARD AND METHOD FOR RADIATING HEAT GENERATED AT THE SAME

(75) Inventors: Kenji Sasaoka, Tokyo (JP); Yoshitaka Fukuoka, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 331 days.

(21) Appl. No.: 12/519,745

(22) PCT Filed: Dec. 14, 2007

(86) PCT No.: PCT/JP2007/074152
§ 371 (c)(1),
(2), (4) Date: Jun. 17, 2009

(87) PCT Pub. No.: WO2008/075629
PCT Pub. Date: Jun. 26, 2008

(65) Prior Publication Data
US 2010/0025082 A1 Feb. 4, 2010

(30) Foreign Application Priority Data

Dec. 18, 2006 (JP) ............... P2006-339689
Dec. 11, 2007 (JP) ............... P2007-319474

(51) Int. Cl.
*H05K 7/20* (2006.01)
*H01K 1/00* (2006.01)
(52) U.S. Cl. ........ 174/252; 361/719; 361/761; 361/764; 257/713

(58) Field of Classification Search .......... None
See application file for complete search history.

(56) References Cited

U.S. PATENT DOCUMENTS

| | | | | |
|---|---|---|---|---|
| 5,386,339 A * | 1/1995 | Polinski, Sr. | ............... | 361/719 |
| 6,031,723 A * | 2/2000 | Wieloch | ............... | 361/719 |
| 6,154,366 A * | 11/2000 | Ma et al. | ............... | 361/704 |
| 6,400,573 B1 * | 6/2002 | Mowatt et al. | ............... | 361/719 |
| 6,414,396 B1 * | 7/2002 | Shim et al. | ............... | 257/778 |
| 6,975,516 B2 | 12/2005 | Asahi et al. | | |
| 6,985,364 B2 * | 1/2006 | Higashitani et al. | ......... | 361/763 |
| 7,230,332 B2 * | 6/2007 | Hsu | ............... | 257/700 |
| 7,294,587 B2 | 11/2007 | Asahi et al. | | |
| 7,485,489 B2 * | 2/2009 | Bjorbell | ............... | 438/106 |
| 7,732,712 B2 * | 6/2010 | Yamano | ............... | 174/260 |

(Continued)

FOREIGN PATENT DOCUMENTS
EP 1 304 742 A2 4/2003
(Continued)

OTHER PUBLICATIONS

International Search Report issued in PCT/JP2007/074152 on Mar. 11, 2008.

(Continued)

*Primary Examiner* — Boris Chervinsky
(74) *Attorney, Agent, or Firm* — Finnegan, Henderson, Farabow, Garrett & Dunner, L.L.P.

(57) ABSTRACT

An electronic component built-in wiring board includes: at least a pair of wiring patterns; an insulating layer disposed between the pair of wiring board; an electronic component embedded in the insulating layer; and a metallic body provided at least on or above a main surface of the electronic component in the insulating layer and thermally contacted with the electronic component.

9 Claims, 4 Drawing Sheets

U.S. PATENT DOCUMENTS

| | | | |
|---|---|---|---|
| 7,968,371 B2 * | 6/2011 | Kim et al. | 438/107 |
| 2005/0255303 A1 | 11/2005 | Sawatari et al. | |
| 2008/0049405 A1 * | 2/2008 | Sahara et al. | 361/761 |

FOREIGN PATENT DOCUMENTS

| | | |
|---|---|---|
| EP | 1 592 061 A2 | 11/2005 |
| EP | 2 056 349 A1 | 5/2009 |
| JP | 2003-197849 | 7/2003 |
| JP | 2004-327624 | 11/2004 |
| JP | 2005-302991 | 10/2005 |
| JP | 2005-311249 | 11/2005 |

OTHER PUBLICATIONS

International Preliminary Report on Patentability and Written Opinion issued by the International Bureau of WIPO on Jun. 23, 2009, for International Application No. PCT/JP2007/074152.

* cited by examiner

ELECTRONIC COMPONENT BUILT-IN WIRING BOARD AND METHOD FOR RADIATING HEAT GENERATED AT THE SAME

CROSS-REFERENCE TO RELATED APPLICATIONS

This application is based upon and claims the benefit of priorities from the prior Japanese Patent Application No. 2006-339689 filed on Dec. 18, 2006 and Japanese Patent Application No. 2007-319474 filed on Dec. 11, 2007; the entire contents which are incorporated herein by reference.

BACKGROUND

1. Field of the Invention

The present invention relates to an electronic component built-in wiring board which can radiate heat generated at the electronic component thereof and a method for radiating the heat generated at the electronic component thereof. The electronic component built-in wiring board is configured such that the electronic component is embedded in an insulating member thereof.

2. Background of the Invention

Recently, with the development and downsizing of an electronic device, it is required to increase the arrangement density of circuit components and to develop the performances of the circuit components. In this point of view, a module with circuit components mounted thereon is required for coping with the high density arrangement and performance enhancement of the electronic components. In order to cope with the requirement for the module, as of now, a multilayered wiring board are intensely studied and researched.

In the multilayered wiring board, a plurality of wiring patterns are arranged so as to be parallel to one another, and a plurality of insulating layers are disposed between the adjacent wiring patterns, respectively so that electronic components such as semiconductor components are embedded into the corresponding insulating layer disposed between the corresponding adjacent wiring patterns. The electronic components are electrically connected with at least one of the wiring patterns. Then, some interlayer connectors (vias) are formed through the insulating layers along the thickness direction of the insulating layers and the wiring patterns are electrically connected with one another (refer to Reference 1).

In the electronic component built-in wiring board, however, the amount of heat of each of the electronic components, particularly, semiconductor components, which are embedded in the corresponding insulating layer, becomes large relatively. On the other hand, since each of the insulating layers is made of low thermal conductivity material such as resin, the heat generated at the electronic component cannot be radiated outside effectively. Therefore, the interior temperature of the wiring board is increased, thereby causing the destruction of the component mounting portion of the electronic component and damaging the connecting portions of the wiring boards. Moreover, the multilayered may emit smoke or catch fire with the increase of the temperature of the multilayered wiring board.

In this point of view, such an attempt is made to impart heat conduction for the insulating layers constituting the electronic component built in wiring board. However, it is very difficult to obtain an insulating material with heat conduction and if can, the insulating material costs, thereby costing the electronic component built-wiring board by itself.

As of now, therefore, the radiating method of capable of radiating the heat generated at the electronic component embedded in the corresponding insulating layer of the electronic component built-in wiring board is being developed and cannot be practically employed.

[Reference 1] JP-A 2003-197849

BRIEF SUMMARY OF THE INVENTION

In view of the above-described problems, it is an object to provide an electronic component built-in wiring board configured such that an electronic component is embedded in the corresponding insulating layer and which can radiate the heat generated at the electronic component effectively and efficiently, thereby preventing the destruction of the mounting portion of the electronic component and the like due to the heat generation from the electronic component.

In order to achieve the above object, the present invention relates to an electronic component built-in wiring board, including: at least a pair of wiring patterns; an insulating layer disposed between the pair of wiring board; an electronic component embedded in the insulating layer; and a metallic body provided at least on or above a main surface of the electronic component in the insulating layer and thermally contacted with the electronic component.

The present invention also relates to a method for radiating heat of an electronic component built-in wiring board including at least a pair of wiring pattern, an insulating layer and an electronic component embedded in the insulating layer, comprising a step of: forming a metallic body so as to be thermally contacted with at least a main surface of the electronic component in the insulating layer to radiate heat emitted from the electronic component.

The inventors studied intensely so as to achieve the object of the present invention. As a result, if a metallic body is thermally contacted with at least a main surface of the electronic component embedded in the insulating layer, the heat generated at the electronic component can be radiated for the surface of the electronic component built-in wiring board and more, the outside thereof via the surface thereof because the metallic body is disposed for the surface thereof. As a result, the destruction of the component mounting portion of the electronic component and damage of the connecting portions of the wiring boards can be prevented. Moreover, the smoke emitting and the fire catching can be also prevented.

Herein, the wording "thermal contact" means that the heat generated at the electronic component is thermally conducted to the metallic body and does not always mean that the electronic component is directly contacted with the metallic body. However, since the metallic body is normally made of excellent thermal conductor, it is desired in fact that the electronic component is directly contacted with the metallic body. The direct contact of the electronic component with the metallic body is effective in the case where no ohmic contact is formed at the contacting portion of the electronic component and the metallic body so that the operation of the electronic component is not disturbed. In such a case, the electronic component is a semiconductor component, for example. Furthermore, the wording "electronic component built-in wiring board" may be abbreviated as "wiring board".

On the other hand, in the case where the electronic component is made of a material with electric conduction and the operation of the electronic component is disturbed when the metallic body is directly contacted with the electronic component, the electronic component cannot be practically and directly contacted with the electronic component. In this case, the metallic body is disposed away from the electronic component. Moreover, since the metallic body and the electronic component are disposed in the respective insulating layers, the metallic body is separated from the electronic component via an insulating material portion of the insulating layers. Alternately, a protective layer with large insulation and thermal conduction may cover the surface of the electronic component so that the metallic body can be contacted directly with the protective layer.

In an aspect of the present invention, the at least a pair of wiring patterns are a plurality of wiring patterns so that a pair of wiring patterns selected from among the plurality of wiring patterns are provided on a main surface and a rear surface of the insulating layer, respectively, and the other wiring patterns of the plurality of wiring patterns are embedded in the insulating layer. Then, by a plurality of interlayer connectors, the plurality of wiring patterns are at least partially and electrically connected with one another and the electronic component is partially and electrically connected with the plurality of wiring patterns.

In this case, the wiring board can be configured as a multilayered wiring board so as to satisfy the recent requirement of high density arrangement of electronic component and high performance in the wiring board.

In another aspect of the present invention, the metallic body and at least one of the plurality of interlayer connectors are formed simultaneously in the same manufacturing step. In this case, since no manufacturing step for the metallic body is required, the manufacturing cost of the electronic component built-in wiring board can be reduced. Since the metallic body and the interlayer connector can be made of the same material, the manufacturing steps for the metallic body and the interlayer connector can be simplified.

The metallic body may be made of conductive composition material of resin and metallic powder dispersed in the resin, in addition to metallic material such as Cu, Al, Au, Ag.

In a still another aspect of the present invention, the electronic component built-in wiring board has a metallic heat radiation plate formed at the same surface level as at least one of the plurality of wiring patterns and thermally contacted with the metallic body. In this case, since the heat emitted from the electronic component is radiated from the metallic heat radiation plate via the metallic body, the heat radiation effect can be enhanced.

In a further aspect of the present invention, the metallic body is a plurality of metallic bodies so that the plurality of metallic bodies are at least partially and thermally contacted with one another in the thickness direction of the insulating layer so as to radiate heat emitted from the electronic component to outside of the electronic component built-in wiring board. In this case, since the heat emitted from the electronic component can be effectively and efficiently radiated to the outside of the electronic component built-in wiring board via the metallic body, the heat radiation effect can be much enhanced. Moreover, if the plurality of metallic bodies are connected with one another via the metallic heat radiation plate, the heat radiation effect can be much more enhanced.

In a still further aspect of the present invention, a heat radiation member is provided which is thermally connected with the outermost metallic body of the plurality of metallic bodies which are located at the outermost surface of the electronic component built-in wiring board. In this case, since the heat emitted from the electronic component is thermally conducted and radiated to the outside of the electronic component built-in wiring board, the heat radiation effect can be enhanced.

According to the present invention can be provided an electronic component built-in wiring board configured such that an electronic component is embedded in the corresponding insulating layer and which can radiate the heat generated at the electronic component effectively and efficiently, thereby preventing the destruction of the mounting portion of the electronic component and the like due to the heat generation from the electronic component.

BEST MODE FOR IMPLEMENTING THE INVENTION

Hereinafter, the present invention will be described in detail with reference to the drawings.

First Embodiment

Figure 1:
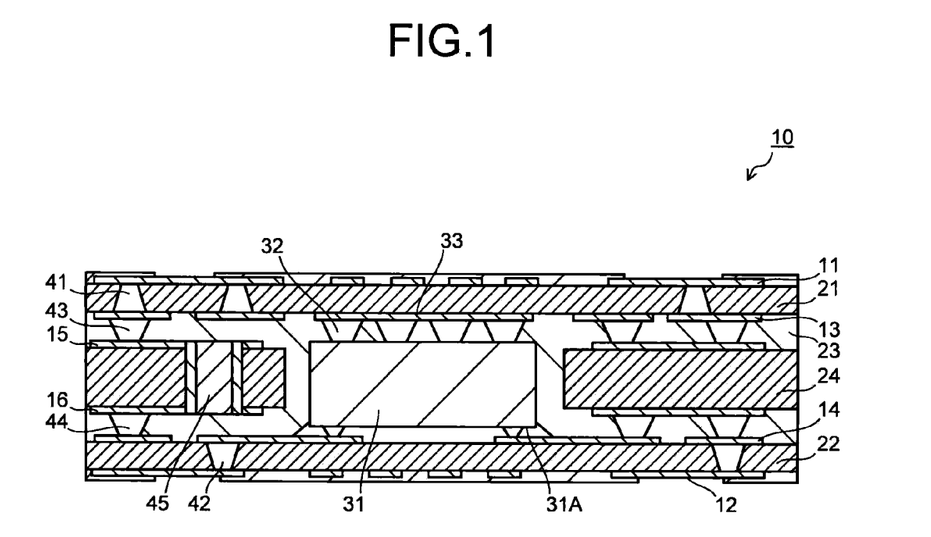
FIG. 1 is a cross sectional view showing the structure of an electronic component built-in wiring board according to a first embodiment.

FIG. 1 is a cross sectional view showing the structure of an electronic component built-in wiring board according to a first embodiment. The electronic component built-in wiring board 10 shown in FIG. 1 includes a first wiring pattern 11 and a second wiring pattern 12 which are positioned at the main surface and the rear surface of the wiring board 10 and almost parallel to one another, and a third wiring pattern 13 and a fourth wiring pattern 14 which are disposed at the inside of the first wiring pattern 11 and the second wiring pattern 12 and almost parallel to one another and to the first wiring pattern 11, the second wiring pattern 12.

A first insulating layer 21 is disposed between the first wiring pattern 11 and the third wiring pattern 13, and a second insulating layer 22 is disposed between the second wiring pattern 12 and the fourth wiring pattern 14. A third insulating layer 23 is disposed between the third wiring pattern 13 and the fourth wiring pattern 14. An electronic component 31 is embedded in the third insulating layer 23 and electrically contacted with the fourth wiring pattern 14 via connecting members 31A.

In the electronic component built-in wiring board 10 shown in FIG. 1, a fourth insulating layer 24 intervenes in the third insulating layer 23. Then, a fifth wiring pattern 15 is formed on the main surface of the fourth insulating layer 24, and a sixth wiring pattern 16 is formed on the rear surface of the fourth insulating layer 24.

The first wiring pattern 11 is electrically with the third wiring pattern 13 via bumps 41 formed through the first insulating layer 21, and the second wiring pattern 12 is electrically with the fourth wiring pattern 14 via bumps 42 formed through the second insulating layer 22. Then, the third wiring pattern 13 is electrically connected with the fifth wiring pattern 15 via bumps 43 formed through the portions of the third insulating layer 23 located between the third wiring pattern 13 and the fifth wiring pattern 15, and the fourth wiring pattern 14 is electrically connected with the sixth wiring pattern 16 via bumps 44 formed through the portions of the third insulating layer 23 located between the fourth wiring pattern 14 and the sixth wiring pattern 16.

The fifth wiring pattern 15 is electrically connected with the sixth wiring pattern 16 with an interlayer conductor 45 formed on the inner wall of the through-hole formed in the fourth insulating layer 24. In this way, the first through the sixth wiring patterns 11 to 16 are electrically connected with one another with the bumps 41 to 44 and the interlayer conductor 45. Moreover, the electronic component 31 is electrically connected with the wiring patterns 11 to 16 via the fourth wiring pattern 14.

Herein, the bumps 41 to 44 and the interlayer conductor 45 constitute interlayer connectors, respectively.

In the electronic component built-in wiring board 10 shown in FIG. 1, a metallic heat radiation plate 33 (hereafter, often called as a "metallic plate") is provided almost at the same surface level as the third wiring pattern 13, and metallic bodies 32 are provided so as to be contacted with the top surfaces of the metallic plate 33 and the electronic component 31. Therefore, if the electronic component is operated so as to emit heat, the emitted heat is thermally conducted to the metallic plate 33 via the metallic bodies 32, and radiated via the metallic plate 33.

Since the metallic bodies 32 is disposed at the side of the surface of the wiring board 10 as viewed from the electronic component 31, the heat emitted from the electronic component 31 is thermally and easily conducted to the area near the surface of the wiring board 10. Then, the metallic bodies 32 is connected with the metallic plate 33 provided at the area near the surface of the wiring board 10. Therefore, the heat emitted from the electronic component 31 is thermally conducted to the area near the surface of the wiring board 10, and then, radiated via the metallic plate 33. In this way, the emitted heat at the electronic component 31 can be radiated at the area near the surface of the wiring board 10.

In the electronic component built-in wiring board 10 shown in FIG. 1, therefore, the emitted heat at the electronic component 31 embedded in the third insulating layer 23 can be radiated to the area near the surface of the wiring board 10 and to the outside via the surface area thereof effectively and efficiently. As a result, the destruction of the component mounting portion, that is, the connection between the electronic component 31 and the fourth wiring pattern 14, the damage for the connections between the wiring patterns and bumps, and smoke emission and fire catching, which are originated from the increase of the interior temperature of the wiring board 10, can be prevented.

The metallic bodies 32 and the metallic heat radiation plate 33 may be made of a material with large heat conduction such as Cu, Al, Au, Ag. Alternately, the metallic bodies 32 and the metallic plate 33 may be made of a conductive composition material of resin and metallic powders dispersed in the resin. The bumps 41 to 44, the interlayer conductor 45 and the wiring patterns 11 to 16 may be made of the same material as the metallic bodies 32 and the metallic plate 33. In this point of view, particularly, the metallic bodies 32 and the bumps 43 can be made simultaneously at the same manufacturing step. Moreover, the metallic plate 33 and the third wiring pattern 13 can be made simultaneously at the same manufacturing step.

In FIG. 1, the first through the fourth insulating layers 21 to 24 are drawn discriminably under normal condition because the first through the fourth insulating layers 21 to 24 are made of the corresponding prepregs as raw materials through heating process in the manufacture of the wiring board 10 and subsequently formed. However, the first through the fourth insulating layers 21 to 24 may not be discriminated in dependence on the kinds of material constituting the insulating layers and the heating condition.

The first through the fourth insulating layers 21 to 24 may contain reinforcing material such as glass fiber appropriately. Particularly, the reinforcing material can be easily contained in the thicker fourth insulating layer 24, thereby increasing the total strength of the electronic component built-in wiring board 10.

The insulating layers may be made of thermosetting resin commercially available. The connecting members 31A for connecting the electronic component 31 with the fourth wiring pattern may be made of solder or the like.

In this case, the metallic bodies 32 are directly contacted with the top surface of the electronic component 31, but not always required only if the heat radiation at the electronic component 31 is sufficiently conducted to the metallic bodies 32. For example, a portion of the third insulating layer 23 may intervenes between the metallic bodies 32 and the electronic component 31.

Figure 2:
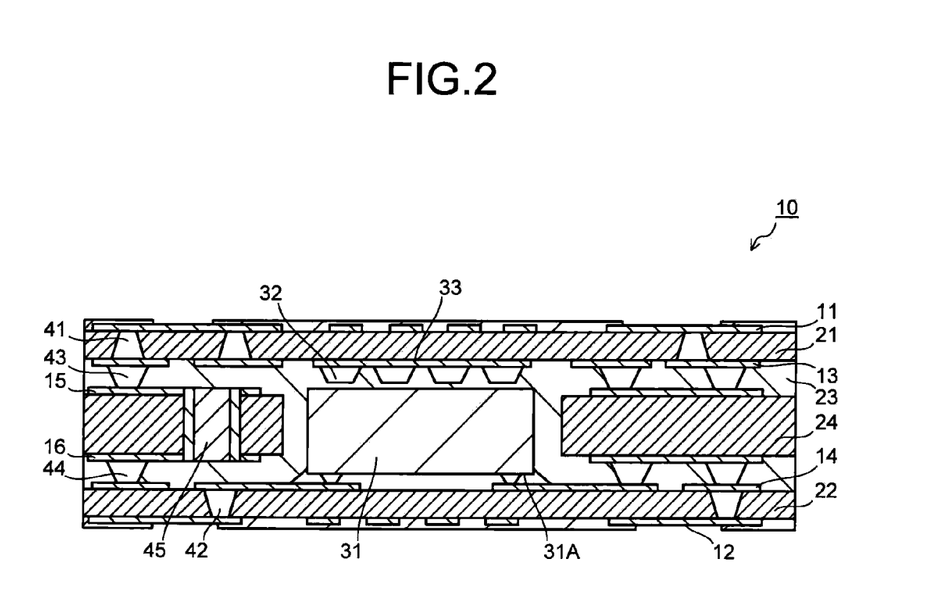
FIG. 2 is a cross sectional view showing the structure of a modified electronic component built-in wiring board according to the first embodiment.

FIG. 2 is a structural view showing the modified electronic component built-in wiring board 10 where the metallic bodies 32 is not directly contacted with the electronic component 31. In this embodiment, as shown in FIG. 2, the metallic bodies 32 is not contacted directly with the top surface of the electronic component 31 so that a portion of the third insulating layer 23 intervenes between the metallic bodies 32 and the electronic component 31.

In this embodiment, if the distance between the metallic bodies 32 and the electronic component 31 is appropriately controlled, the heat emission at the electronic component 31 is thermally conducted in the third insulating layer 23 and thermally absorbed at the metallic bodies 32. Thereafter, the heat absorbed at the metallic bodies 32 are thermally conducted to the metallic plate 33 and then, radiated to the outside of the wiring board 10 via the surface thereof. Therefore, the destruction of the component mounting portion, that is, the connection between the electronic component 31 and the fourth wiring pattern 14, the damage for the connections between the wiring patterns and bumps, and smoke emission and fire catching, which are originated from the increase of the interior temperature of the wiring board 10, can be prevented.

In the electronic component built-in wiring board 10 as shown in FIG. 2, the distance between the top of the metallic bodies 32 and the top surface of the electronic component 31 is preferably set within a range of 5 µm to 100 µm in order to maintain the heat radiation effect.

If the metallic bodies 32 are directly contacted with the electronic component 31, the heat radiation effect can be enhanced.

As shown in FIG. 1, when the metallic bodies 32 are directly contacted with the electronic component 31, it is required not to damage the operation of the electronic component 31 due to the contact therebetween. In this case, the electronic component is a semiconductor component, for example. Namely, the structure of the wiring board 10 shown in FIG. 1 is most effective in the case where the electronic component 31 is the semiconductor component.

On the other hand, in the case where the electronic component 31 has electric conduction so that the operation of the electronic component 31 is damaged due to the contact with the metallic bodies 32, if the electronic component 31 is covered with a protective layer with insulation and preferably thermal conduction, such a disadvantage as described above due to the direct contact can be prevented.

In this case, the metallic plate 33 is provided, but the heat radiation effect for the electronic component 31 can be sufficiently maintained only if the metallic bodies 32 are provided without the metallic plate 33. However, if the metallic plate 33 is provided, the heat radiation effect can be enhanced.

Second Embodiment

Figure 3:
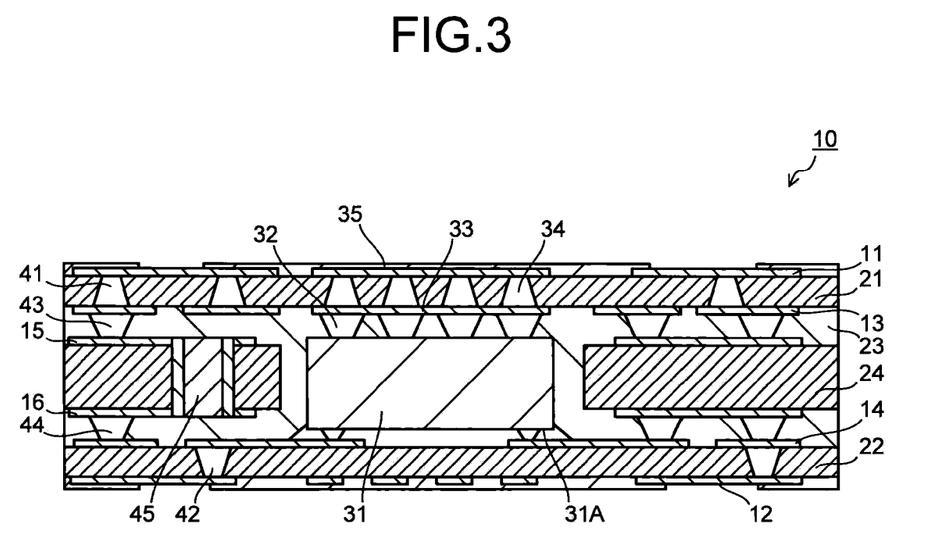
FIG. 3 is a cross sectional view showing the structure of an electronic component built-in wiring board according to a second embodiment.

FIG. 3 is a cross sectional view showing the structure of an electronic component built-in wiring board according to a second embodiment. Like or corresponding components are designated by the same reference numerals through the drawings.

The electronic component built-in wiring board 10 in this embodiment is similar to the one in the first embodiment except that an additional metallic heat radiation plate 35 is provided on the first insulating layer 21 at the same surface level as the first wiring pattern 11, and an additional metallic bodies 34, which penetrates through the first insulating layer 21 and are connected with the metallic plates, 33, 35, is provided.

In the electronic component built-in wiring board 10 shown in FIG. 3, the metallic bodies 32 and 34 are connected with one another via the metallic plate 33, and the metallic bodies 34 are connected with the metallic plate 35 which is formed on the outermost surface of the wiring board 10. Therefore, the heat emitted from the electronic component 31 is thermally conducted to the metallic plate 35 located at the outermost surface of the wiring board 10 through the metallic bodies 32, 34 and the metallic plate 35, and then, directly radiated to the outside of the wiring board 10 by the metallic plate 35. In this point of view, the heat radiation effect for the electronic component 31 of the wiring board 10 in this embodiment can be enhanced in comparison with the electronic component built-in wiring board 10 shown in FIG. 1.

The heat emitted from the electronic component 31 is almost radiated to the outside of the wiring board 10 via the metallic plate 35, but partially radiated via the metallic plate 33 and the metallic bodies 32, 34. In this point of view, the heat radiation effect for the electronic component built-in wiring board 10 can be enhanced in comparison with the electronic component built-in wiring board 10 shown in FIG. 1.

As a result, the heat emitted from the electronic component 31, embedded in the third insulating layer 23, is thermally and easily conducted to the area near the surface of the wiring board 10 and then, radiated to the outside of the wiring board 10 via the surface thereof. Accordingly, the destruction of the component mounting portion, that is, the connection between the electronic component 31 and the fourth wiring pattern 14, the damage for the connections between the wiring patterns and bumps, and smoke emission and fire catching, which are originated from the increase of the interior temperature of the wiring board 10, can be prevented.

The additional metallic bodies 34 and the additional metallic plate 35 may be made of the same materials as the metallic bodies 32 and the metallic plate 33, respectively.

The additional metallic bodies 34 and the additional metallic heat radiation plate 35 may be made of a material with large heat conduction as the bumps 41 to 44 and the wiring pattern 11 to 16. In this point of view, the metallic bodies 34 and the bump 41 can be made simultaneously at the same manufacturing step. Moreover, the metallic plate 35 and the first wiring pattern 11 can be made simultaneously at the same manufacturing step.

Other components such as wiring patterns, insulating layers and interlayer connectors including bumps may be configured in the same manner as the ones shown in FIG. 1.

Figure 4:
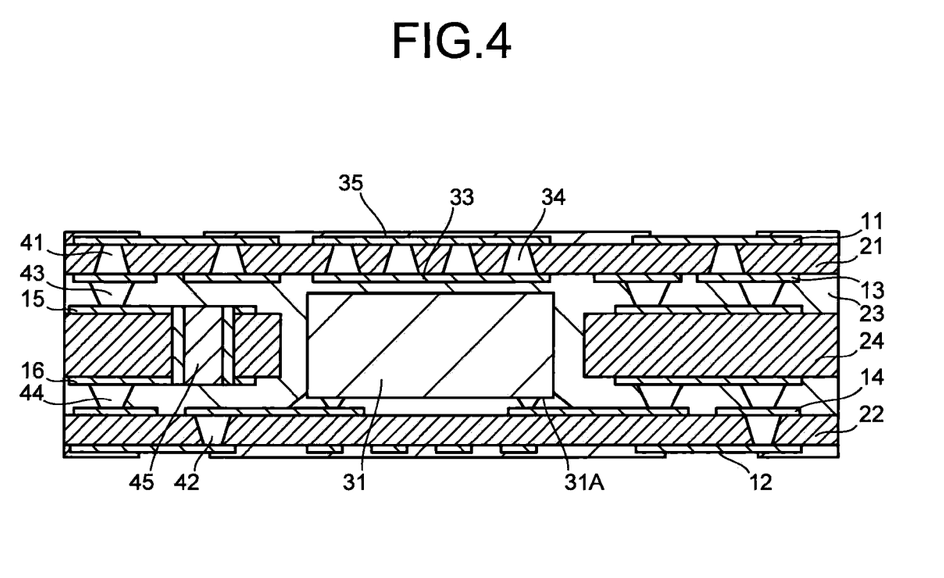
FIG. 4 is a cross sectional view showing the structure of a modified electronic component built-in wiring board according to the second embodiment.

FIG. 4 is a structural view showing a modified electronic component built-in wiring board 10 in this embodiment. In this embodiment, the metallic bodies 32 is removed so that no metallic body is directly contacted with the electronic component 31. In this embodiment, as shown in FIG. 4, the heat emission at the electronic component 31 is thermally conducted in a portion of the third insulating layer 23 located between the electronic component 31 and the metallic plate 33 and thermally absorbed at the metallic plate 33. Thereafter, the heat absorbed at the metallic plate 33 is thermally conducted to the additional metallic plate 35 via the additional metallic bodies 34 and then, radiated to the outside of the wiring board 10 via the surface thereof.

Therefore, the destruction of the component mounting portion, that is, the connection between the electronic component 31 and the fourth wiring pattern 14, the damage for the connections between the wiring patterns and bumps, and smoke emission and fire catching, which are originated from the increase of the interior temperature of the wiring board 10, can be prevented.

Herein, since the metallic bodies 32 are not disposed between the electronic component 31 and the metallic plate 33, the distance between the electronic component 31 and the metallic plate 33 must be appropriately controlled in order to thermally connect the electronic component 31 and the metallic plate 33. For example, the distance may be set within a range of 5 µm to 100 µm.

Third Embodiment

Figure 5:
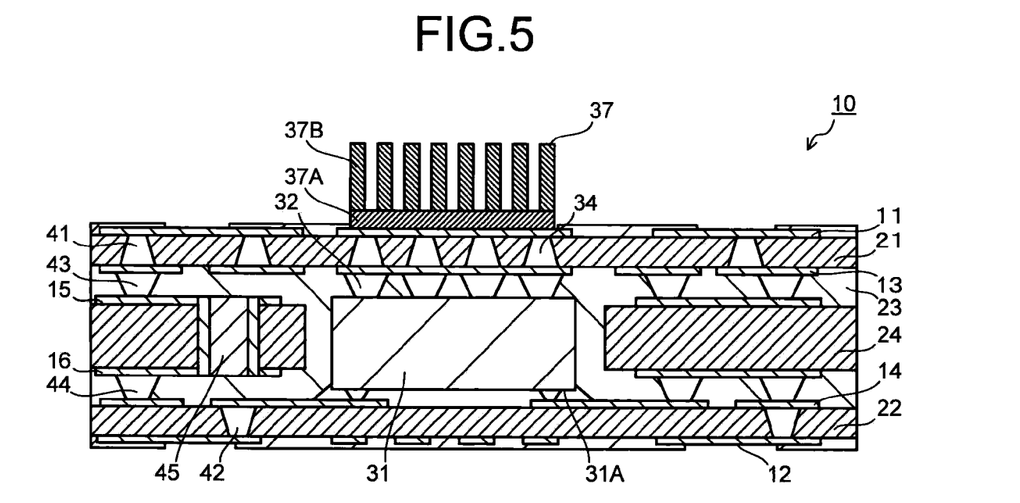
FIG. 5 is a cross sectional view showing the structure of an electronic component built-in wiring board according to a third embodiment.

FIG. 5 is a cross sectional view showing the structure of an electronic component built-in wiring board according to a third embodiment. Like or corresponding components are designated by the same reference numerals through the drawings.

In the electronic component built-in wiring board 10 in this embodiment, the additional metallic heat radiation plate 35 is provided on the first insulating layer 21 at the same surface level as the first wiring pattern 11 and the additional metallic bodies 34 are provided which is formed through the first insulating layer 21 and connected with the metallic heat radiation plates 33 and 35. Moreover, a heat sink 37 is provided as a heat radiation member so as to be contacted with the metallic heat radiation plate 35.

In this embodiment, the metallic bodies 32 are connected with the metallic bodies 34 via the metallic plate 33 and the metallic bodies 34 are connected with the metallic plate 35 formed on the outermost surface of the wiring board 10. Moreover, the heat sink 37 is provided so as to be contacted with the metallic plate 35.

Therefore, the heat emitted from the electronic component 31 is thermally conducted to the metallic plate 35 located at the outermost surface of the wiring board 10 through the metallic bodies 32, 34 and the metallic plate 35, and then, radiated effectively and efficiently by the heat sink 37 connected with the metallic plate 35. In this point of view, the heat radiation effect of the wiring board 10 in this embodiment can be enhanced in comparison with the wiring board 10 as shown in FIGS. 1 to 4.

The heat emitted from the electronic component 31 is almost radiated via the heat sink 37, but partially radiated via the metallic plates 33,35 and the metallic bodies 32, 34. In view of the effect of the heat sink 37, it is apparent that the heat radiation effect of the wiring board 10 in this embodiment is enhanced in comparison with the wiring board 10 as shown in FIGS. 1 to 4.

As a result, in the wiring board 10 shown in FIG. 5, the heat emitted from the electronic component 10 embedded in the third insulating layer 23 can be radiated to the area near the surface of the wiring board 10 and then, radiated to the outside of the wiring board 10 via the surface thereof. Accordingly, the destruction of the component mounting portion, that is, the connection between the electronic component 31 and the fourth wiring pattern 14, the damage for the connections between the wiring patterns and bumps, and smoke emission and fire catching, which are originated from the increase of the interior temperature of the wiring board 10, can be prevented.

The additional metallic bodies 34 and the additional metallic plate 35 may be made of the same materials as the metallic bodies 32 and the metallic plate 33, respectively, in the same manner as the embodiment relating to FIG. 3.

The additional metallic bodies 34 and the additional metallic heat radiation plate 35 may be made of a material with large heat conduction as the bumps 41 to 44 and the wiring pattern 11 to 16 in the same manner as the embodiment relating to FIG. 3. In this point of view, the metallic bodies 34 and the bumps 41 can be made simultaneously at the same manufacturing step. Moreover, the metallic plate 35 and the first wiring pattern 11 can be made simultaneously at the same manufacturing step.

Other components such as wiring patterns, insulating layers and interlayer connectors including bumps may be configured in the same manner as the ones shown in FIG. 1.

The heat sink 37 is configured such that a plurality of radiating plates are provided on a base 37A as shown in FIG. 5. Therefore, if the arrangement density of the radiating plates is increased, the heat radiation effect can be much enhanced.

Micro-scaled borings may be employed instead of the heat sink 37. Alternatively, a cooling medium circulating apparatus may be employed.

Although the present invention was described in detail with reference to the above examples, this invention is not limited to the above disclosure and every kind of variation and modification may be made without departing from the scope of the present invention.

For example, in those embodiments, the number of insulating layer is set to four, but may be adjusted in accordance with the number of electronic component to be embedded and the like. Concretely, the number of insulating layer is set to two, or five or more. The number of wiring pattern is set in accordance with the number of insulating layer.

The electronic component built-in wiring board 10 shown in the embodiments may be fabricated by means of any fabricating method. Preferably, the wiring board 10 may be fabricated by means of B$^2$it (registered trademark) or ALIVE. "B$^2$it" and "ALIVE" are well known technique as described in "Build-up multilayer printed wiring board", published by "Nikkan Kogyo Shimbum, Ltd".

Hereinafter, the process for manufacturing the electronic component built-in wiring board 10 in the first embodiment will be described simply.

FIGS. 6 to 11 are steps relating to the manufacturing process of the electronic component built-in wiring board 10.

Figure 6:
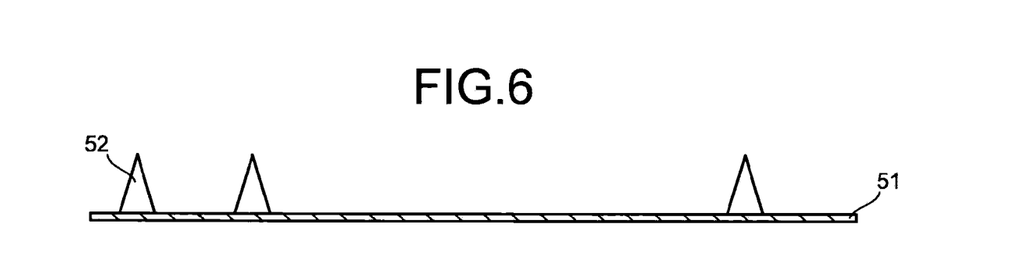
FIG. 6 is a cross sectional view showing a step in the manufacturing method of the electronic component built-in wiring board of the first embodiment.
Figure 7:
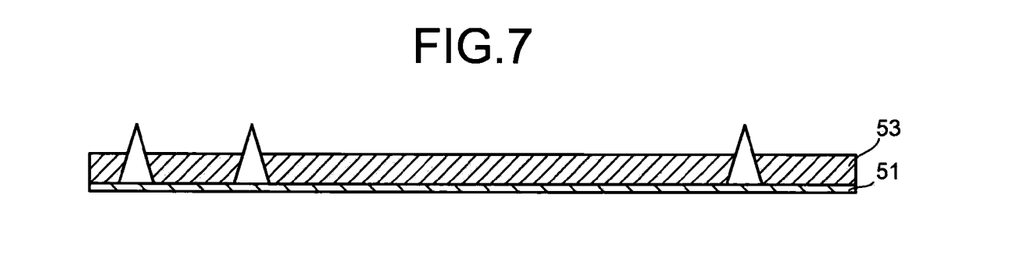
FIG. 7 is also a cross sectional view showing a step in the manufacturing method of the electronic component built-in wiring board of the first embodiment.
Figure 8:
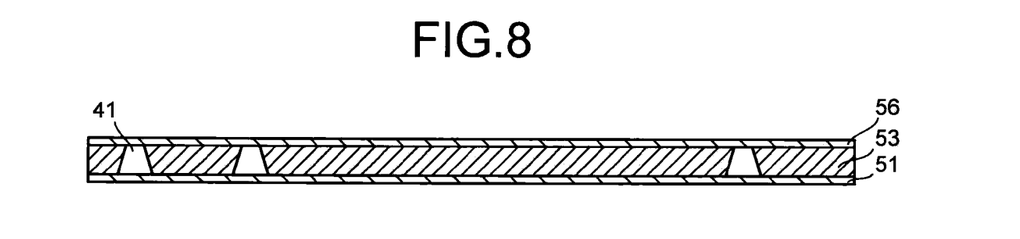
FIG. 8 is also a cross sectional view showing a step in the manufacturing method of the electronic component built-in wiring board of the first embodiment.

First of all, as shown in FIG. 6, conical bumps 52 made of conductive material are formed on a metallic (e.g., Cu) foil 51 by means of screen printing. Then, as shown in FIG. 7, an insulating layer 53 is formed so that the bumps 52 can penetrate through the insulating layer 53. Then, as shown in FIG. 8, a metallic (e.g., Cu) layer 56 is disposed on the insulating layer 53, and then, pressed under heating and pressurizing condition so as to harden the insulating layer 53, thereby forming a metallic (Cu) foils both-sided plate. In this case, the tops of the bumps 52 are flattened to form the intended bumps 41.

Figure 9:
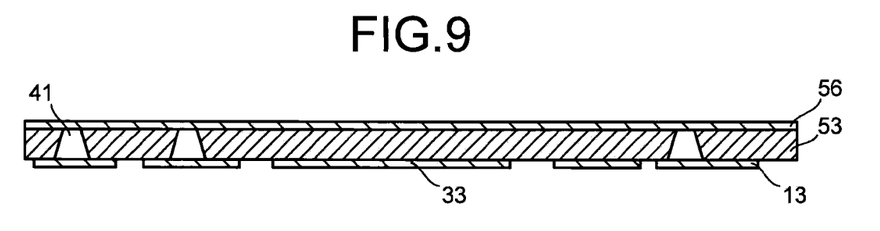
FIG. 9 is also a cross sectional view showing a step in the manufacturing method of the electronic component built-in wiring board of the first embodiment.

Then, the metallic foil 51 is patterned by means of photolithography to form the wiring pattern 13 and the metallic heat radiation plate 33 as shown in FIG. 9. Then, as shown in FIG. 10, conical bumps 43 are formed on the wiring pattern 13 and conical metallic bodies 32 are formed on the metallic heat radiation plate 33 so that an insulating layer 54 is formed so that the bumps 43 and the metallic bodies 32 can penetrate through the insulating layer 54 and can be embedded with the insulating layer 54.

In this way, according to the above-described manufacturing method, the metallic bodies 32 and the bumps 43 can be made simultaneously at the same manufacturing step. Moreover, the metallic plate 33 and the third wiring pattern 13 can be made simultaneously at the same manufacturing step. Therefore, no manufacturing step for the metallic bodies 32 and the metallic heat radiation plate 33 are required so that the manufacturing steps for the metallic bodies 32 and the metallic heat radiation plate 33 can be incorporated in the normal manufacturing process of the electronic component built-in wiring board 10.

Figure 10:
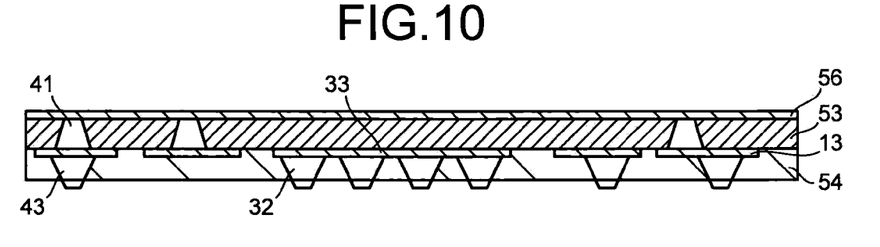
FIG. 10 is also a cross sectional view showing a step in the manufacturing method of the electronic component built-in wiring board of the first embodiment.
Figure 11:
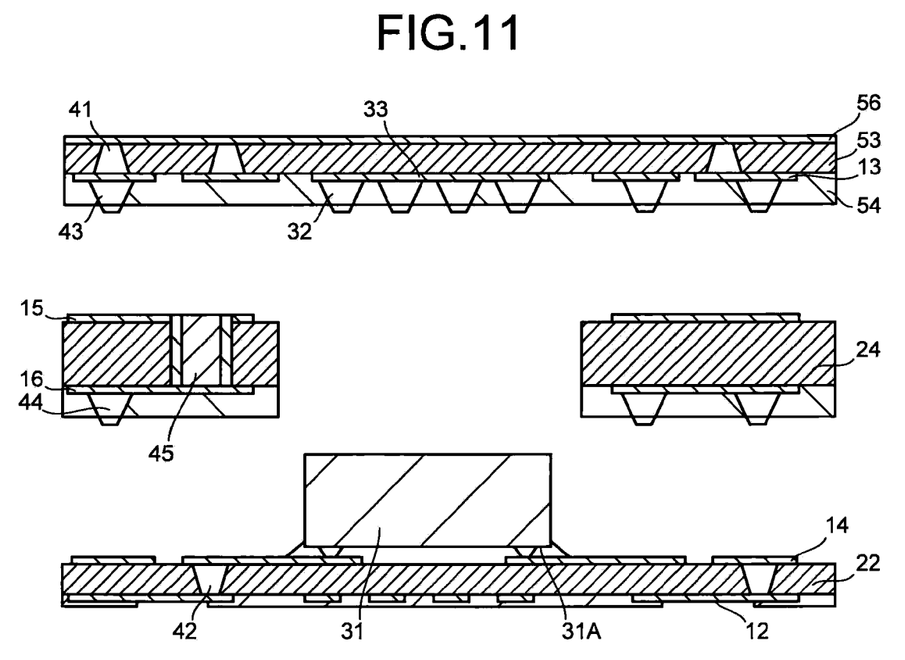
FIG. 11 is also a cross sectional view showing a step in the manufacturing method of the electronic component built-in wiring board of the first embodiment.

Then, as shown in FIG. 11, another assembly with the electronic component 31 mounted thereon is prepared in addition to the assembly obtained in the step shown in FIG. 10 and then, the assembly and another assembly are laminated vertically via other assemblies under the pressurizing and heating condition. Then, the metallic foil 56 is patterned to be the first insulating layer 11, thereby forming the electronic component built-in wiring board 10.

In the manufacturing the electronic component built-in wiring board 10 in the second embodiment, the additional metallic plate 34 and the bump 41 are formed simultaneously. The additional metallic plate 35 is formed in the step of patterning the first wiring layer 11.

What is claimed is:

1. An electronic component built-in wiring board, comprising:
   a plurality of wiring patterns;
   an insulating layer disposed between a pair of said wiring patterns, said pair of wiring patterns being provided on a main surface and a rear surface of said insulating layer, respectively;
   an electronic component embedded in said insulating layer;
   a plurality of interlayer connectors;

a metallic body provided at least on or above a main surface of said electronic component and thermally contacted with said electronic component; and a metallic heat radiation plate formed at a same surface level as at least one of said wiring patterns and thermally contacted with said metallic body, wherein:

said plurality of wiring patterns further comprise additional wiring patterns embedded in said insulating layer; and said wiring patterns are at least partially and electrically connected with one another by the interlayer connectors, and said electronic component is partially and electrically connected with said wiring patterns.

2. The electronic component built-in wiring board as set forth in claim 1, wherein at least one of said plurality of interlayer connectors has an axis along a thickness direction of said insulating layer and a diameter along said axis of said at least one interlayer connector is varied along said thickness direction of said insulating layer.

3. The electronic component built-in wiring board as set forth in claim 1, wherein said metallic body and at least one of said plurality of interlayer connectors are made of the same material.

4. The electronic component built-in wiring board as set forth in claim 1, wherein said metallic body and at least one of said plurality of interlayer connectors are made of the same conductive composition material.

5. The electronic component built-in wiring board as set forth in claim 1, wherein said metallic body and at least one of said plurality of interlayer connectors are formed simultaneously in the same manufacturing step.

6. The electronic component built-in wiring board as set forth in claim 1, wherein said metallic body comprises a plurality of metallic bodies such that said plurality of metallic bodies are at least partially and thermally contacted with one another so as to radiate heat emitted from said electronic component to outside of said electronic component built-in wiring board.

7. The electronic component built-in wiring board as set forth in claim 6, wherein said plurality of metallic bodies are at least partially and thermally contacted with one another in a thickness direction of said insulating layer via said metallic heat radiation plate.

8. The electronic component built-in wiring board as set forth in claim 6, further comprising a heat radiation member thermally connected with an outermost metallic body of said plurality of metallic bodies which are located at an outermost surface of said electronic component built-in wiring board.

9. The electronic component built-in wiring board as set forth in claim 1, wherein said electronic component is a semiconductor component.

* * * * *